(12) United States Patent
Lauxtermann

(10) Patent No.: US 7,936,039 B2
(45) Date of Patent: May 3, 2011

(54) BACKSIDE ILLUMINATED CMOS IMAGE SENSOR WITH PHOTO GATE PIXEL

(75) Inventor: Stefan Clemens Lauxtermann, Camarillo, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 8 days.

(21) Appl. No.: 12/254,734

(22) Filed: Oct. 20, 2008

(65) Prior Publication Data

US 2010/0096675 A1   Apr. 22, 2010

(51) Int. Cl.
*H01L 31/10* (2006.01)
(52) U.S. Cl. .......... 257/460; 257/E31.073; 257/E31.114
(58) Field of Classification Search .................. 257/447, 257/460, E31.053, E31.073, E31.113, E31.114
See application file for complete search history.

(56) References Cited

U.S. PATENT DOCUMENTS

| | | | |
|---|---|---|---|
| 5,898,168 A | 4/1999 | Gowda et al. | |
| 6,642,561 B2 | 11/2003 | Kakumoto et al. | |
| 6,821,809 B2 | 11/2004 | Abe et al. | |
| 7,002,626 B2 * | 2/2006 | Pain et al. | 348/241 |
| 7,075,614 B2 | 7/2006 | Izumi et al. | |
| 7,126,100 B1 | 10/2006 | Chuang et al. | |
| 7,166,878 B2 * | 1/2007 | Janesick et al. | 257/290 |
| 7,381,953 B1 | 6/2008 | Kaufman | |
| 7,382,008 B2 | 6/2008 | Xu | |
| 7,498,650 B2 * | 3/2009 | Lauxtermann | 257/460 |
| 2005/0029561 A1 | 2/2005 | Suzuki et al. | |
| 2006/0197007 A1 | 9/2006 | Iwabuchi et al. | |
| 2007/0235827 A1 * | 10/2007 | Altice | 257/428 |
| 2008/0111168 A1 | 5/2008 | Andou et al. | |
| 2008/0122956 A1 * | 5/2008 | Xu et al. | 348/249 |
| 2008/0290441 A1 * | 11/2008 | Hsu et al. | 257/460 |
| 2009/0236644 A1 * | 9/2009 | Adkisson et al. | 257/292 |

* cited by examiner

*Primary Examiner* — Sue A Purvis
*Assistant Examiner* — W. Wendy Kuo
(74) *Attorney, Agent, or Firm* — Koppel, Patrick, Heybl & Dawson

(57) ABSTRACT

A pixel for a CMOS photo sensor with increased full well capacity is disclosed. The pixel having a photosensitive element, a photo gate, potential well and a readout circuit. The photosensitive element having a front side and a back side, for releasing charge when light strikes the back side of the photosensitive element. The potential well receives the released charge from the photosensitive element. The photo gate located on the front side of the photosensitive element, for transferring the released charge from the potential well to a sense node. The readout circuit coupled to the sense node, for measuring a voltage corresponding to the released charge transferred to the sense node.

6 Claims, 6 Drawing Sheets

ND CMOS IMAGE
BACKSIDE ILLUMINATED CMOS IMAGE SENSOR WITH PHOTO GATE PIXEL

BACKGROUND

This disclosure relates generally to photo sensors. More specifically, the disclosure relates to backside illuminated CMOS image sensors with photo gate pixel.

SUMMARY

A backside illuminated CMOS image sensor is disclosed. The backside illuminated CMOS image sensor includes a photosensitive element, a photo gate, a sense diffusion and a readout circuit. The photosensitive element having a front side and a back side, for releasing charge when light strikes the back side of the photosensitive element. The photo gate on the front side on the photosensitive element. The photo gate having a potential well for receiving the released charge from the photosensitive element. The sense node, adjacent the photo gate, receives the released charge from the potential well. The readout circuit coupled to the sense node, for measuring a voltage corresponding to the released charge transferred to the sense node.

In one embodiment, the backside illuminated CMOS image sensor includes a drain switch adjacent the photo gate on the front side of the photosensitive element, for draining excess charge from the photo gate. The backside illuminated CMOS image sensor may also include a transfer switch between the photo gate and the sense node, for transferring the released charge from the photo gate to the sense node and for isolating the charge transferred to the sense node from the photo gate. The backside illuminated CMOS image sensor may further include a reset transistor and a supply voltage, for draining the charge transferred to the sense node after readout. In one embodiment, the backside illuminated CMOS image sensor may include a deep p implant to shield the sense diffusion from parasitic charge integration.

In one embodiment, a method for increased full well capacity in an image sensor is disclosed. The image sensor having a photosensitive element with a front side and a back side, a photo gate with a potential well on the front side of the photosensitive element, a sense node and a readout circuit. The method includes generating a charge when light strikes the back side of the photosensitive element, collecting the generated charge in the potential well of the photo gate, and transferring the generated charge from the potential well of the photo gate to the sense node to generate a corresponding readout voltage.

In one embodiment, the method includes generating a first corresponding readout voltage prior to the step of transferring all of the generated charge from the potential well of the photo gate to the sense node, comparing the first corresponding readout voltage to a threshold voltage, and if the first corresponding readout voltage is greater than the threshold voltage, outputting an analog signal for the first corresponding readout voltage. Next, removing the voltage bias to the photo gate after the step of collecting the generated charge in the potential well of the photo gate for transferring the generated charge to the sense node. If the first corresponding readout voltage is less than the threshold voltage, generating a second corresponding readout voltage after the step of transferring the generated charge from the potential well of the photo gate to the sense node, and outputting an analog signal for the second corresponding readout voltage.

DRAWINGS

The above-mentioned features and objects of the present disclosure will become more apparent with reference to the following description taken in conjunction with the accompanying drawings wherein like reference numerals denote like elements and in which.

DETAILED DESCRIPTION

In the description that follows, the present invention will be described in reference to a preferred embodiment that provides increased full well capacity in an image sensor. The present invention, however, is not limited to any particular imaging application nor is it limited by the examples described herein. Therefore, the description of the embodiments that follow are for purposes of illustration and not limitation.

Figure 1:
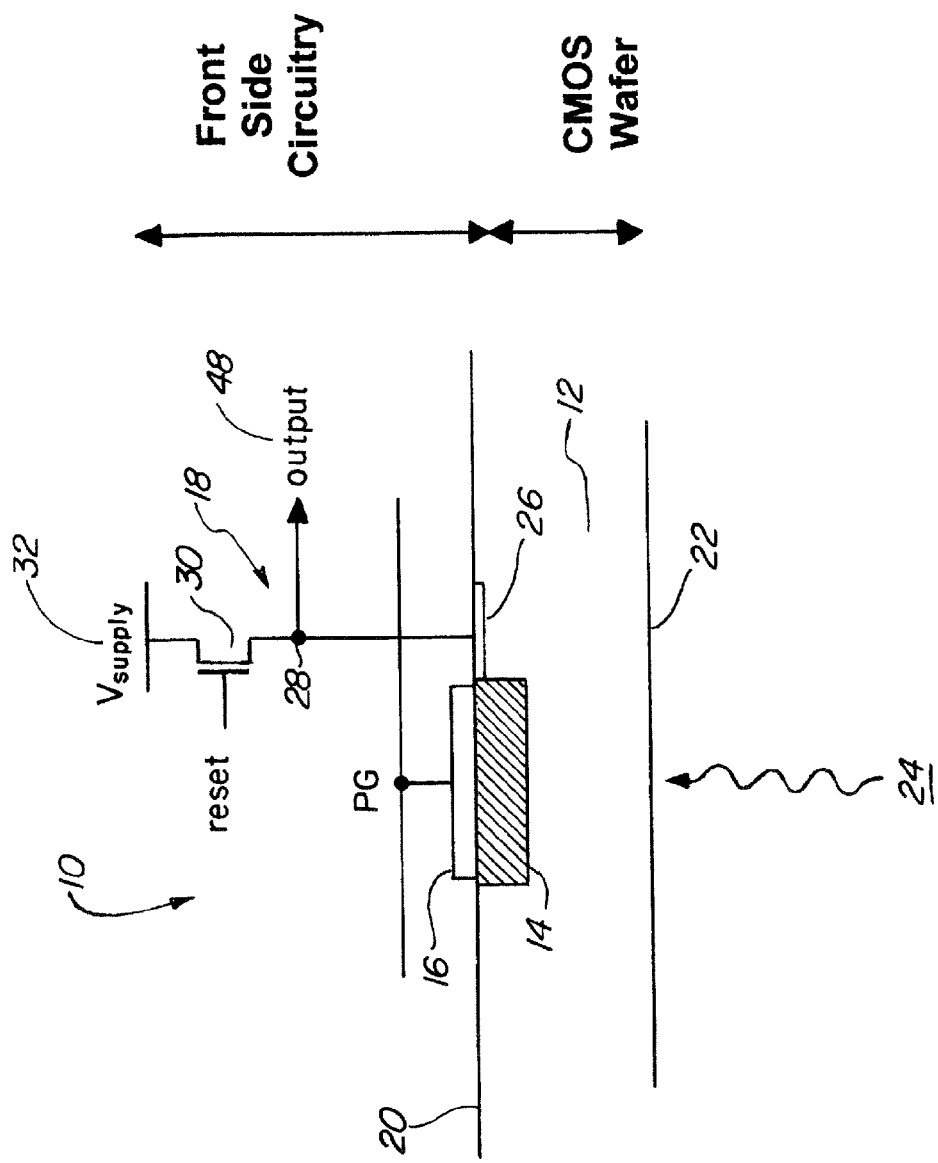
FIG. 1 is a backside illuminated CMOS image sensor, according to an embodiment of the present disclosure.

FIG. 1 illustrates a backside illuminated complementary metal oxide semiconductor (CMOS) image sensor 10, according to an embodiment of the present disclosure. The complementary metal oxide semiconductor may include a plurality of pixels, each pixel may include a photosensitive element 12, a potential well 14, a photo gate 16 and a readout circuit 18.

The photosensitive element 12 has a front side 20 and a back side 22. The photosensitive element 12 may release charge when light 24 strikes the back side 22. The potential well 14 may be partially depleted, as shown in FIG. 1. As can be appreciated, the potential well 14 may also be fully depleted if high resistivity silicon is used, thereby reaching all the way to the back side 22. The photo gate 16, located on the front side 20 of the photosensitive element 12, may be used to transfer the charge from the potential well 14 to a sense diffusion 26. The photo gate 16 may be a silicided transistor gate. In one embodiment, the sense diffusion 26, located on the front side 20, may be an n-type implant for collecting electrons from the potential well 14. In another embodiment, the sense diffusion 26 may be a p-type implant for collecting holes, in which case the polarity of the photo gate 16 would be inverted.

The pixel may also include a readout circuit 18 coupled to the sense diffusion 26. The readout circuit 18 may be used to measure a voltage corresponding to the released charge transferred to the sense diffusion 26. The readout circuit 18 may include a sense node 28, a reset transistor 30 and a supply voltage 32. The sense node 28 couples the readout circuit 18 to the sense diffusion 26. The reset transistor 30 and the supply voltage 32 may be used to drain the charge transferred to the sense diffusion 26 after readout. In one embodiment, the pixel may also include a deep p implant (not shown) to shield the sense diffusion 26 from parasitic charge integration.

Figure 2:
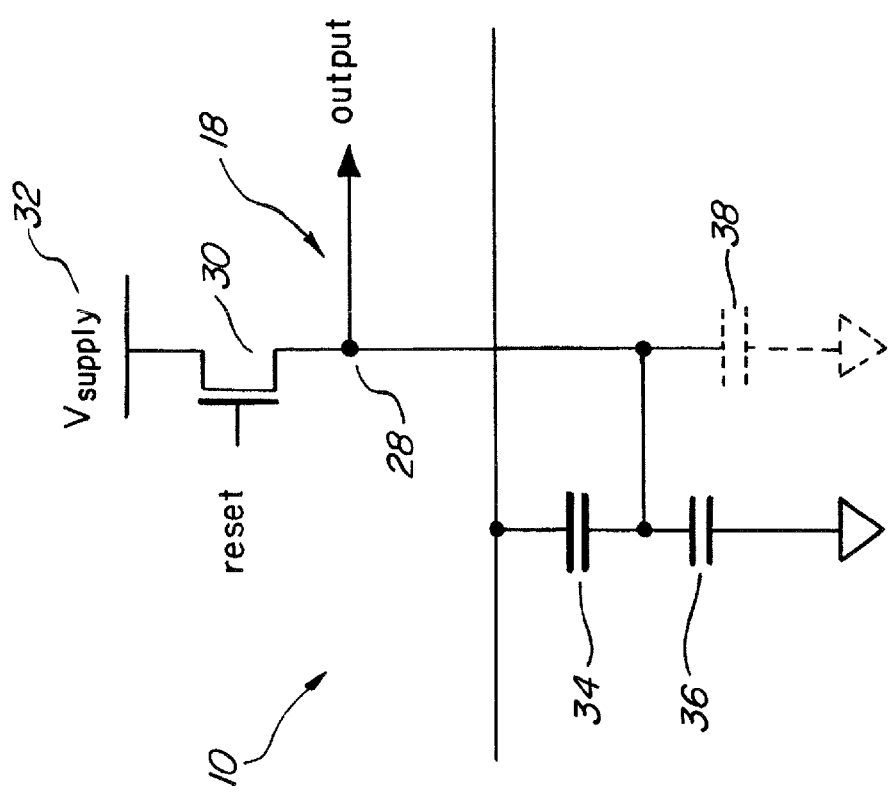
FIG. 2 is an exemplary electrical representation of the backside illuminated CMOS image sensor of FIG. 1, according to an embodiment of the present disclosure.

FIG. 2 is an exemplary electrical representation of the backside illuminated CMOS image sensor 10 of FIG. 1, according to an embodiment of the present disclosure. As is understood by a person skilled in the art, capacitors 34 and 36 are electrical representations of the photo gate 16, while capacitor 38 is an electrical representation of the sense diffusion 26. In one embodiment, the photo gate capacitance may be about 5 fF/μm².

Figure 3:
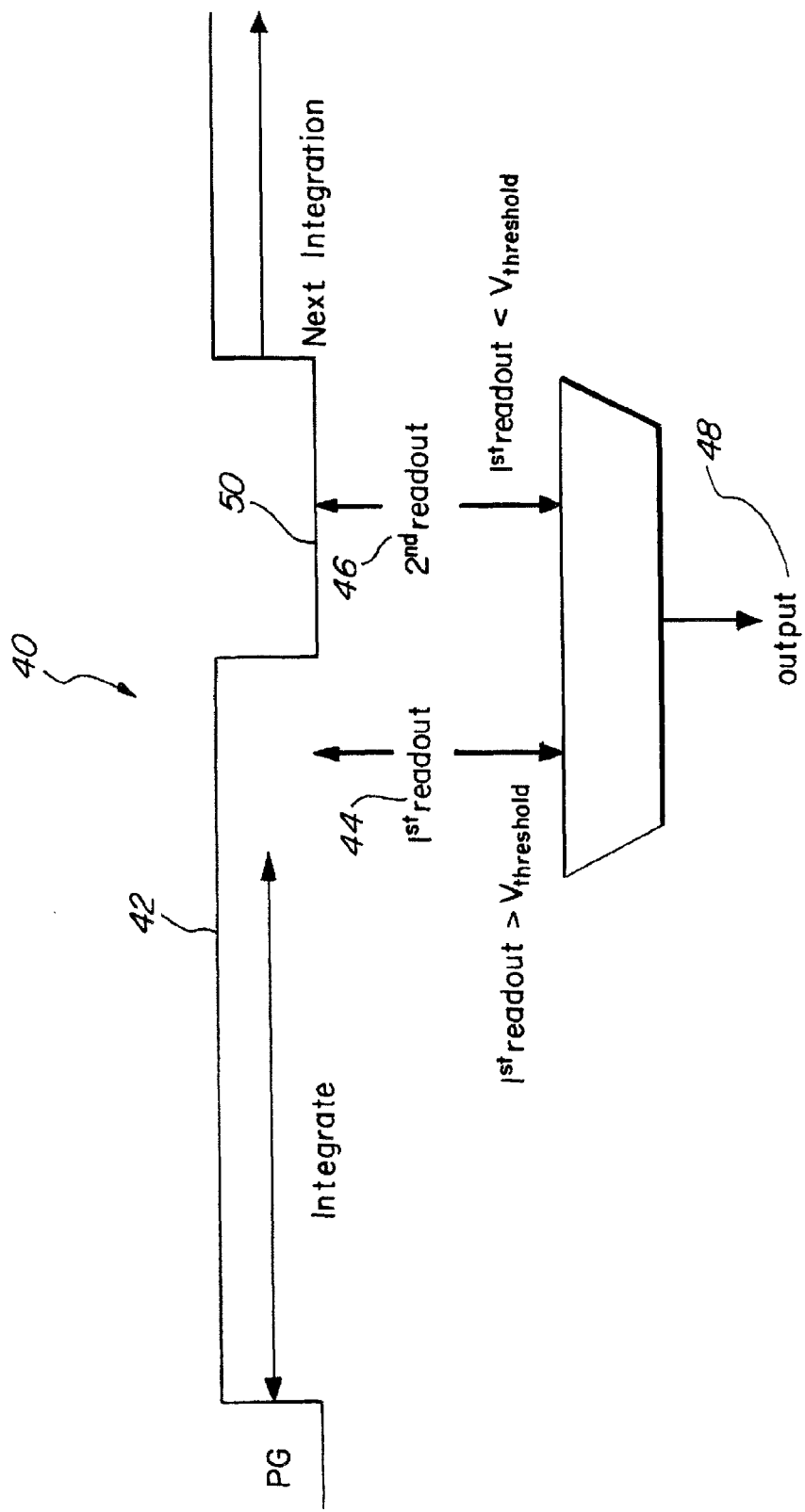
FIG. 3 is an exemplary timing diagram illustrating partial digitization in the backside illuminated CMOS image sensor of FIG. 1, according to an embodiment of the present disclosure.

FIG. 3 is an exemplary timing diagram 40 illustrating partial digitization in the backside illuminated CMOS image sensor 10 of FIG. 1, according to an embodiment of the present disclosure. As can be appreciated, the voltage potential applied to the photo gate 16 is constant during an integration period and not pulsating. For example, the photo gate 16 may be clocked to high 42 during an integration period by applying a voltage bias of about 3.3V to the photo gate 16. Charge generated from light 24 striking the back side 22 of the photosensitive element 12 may then be collected in the potential well 14 adjacent the photo gate 16.

Prior to collapsing the potential well 14 and transferring all generated charge from the potential well 14 to the sense node 28, a first corresponding readout voltage 44 may be generated. The first corresponding readout voltage 44 may then be compared to a threshold voltage $V_{threshold}$. The threshold voltage $V_{threshold}$ may depend on the noise level present at a readout amplifier (not shown). A second corresponding readout voltage 46 may be generated after transferring all generated charge from the potential well 14 to the sense node 28. All of the generated charge may be transferred from the potential well 14 to the sense node 28 by removing the voltage bias to the photo gate 16, thereby clocking the photo gate 16 to a low level 50, for example, to 0 Volts. As can be appreciated, when the photo gate 16 is clocked to a high level 42, the pixel may exhibit maximum full well capacity, and when the photo gate 16 is clocked to the low level 50 upon 2$^{nd}$ readout, the pixel may exhibit maximum gain with lower effective sense node capacitance.

In one embodiment, if the first corresponding readout voltage 44 is greater than the threshold voltage $V_{threshold}$, the pixel may output 48 an analog signal for the first corresponding readout voltage 44. If the first corresponding readout voltage 44 is less than the threshold voltage $V_{threshold}$, the pixel may output 48 an analog signal for the second corresponding readout voltage 46. In one embodiment, the output 48 may include the analog signal and a one bit information at the column level. The analog signal may be determined by the amount of charge transferred to the sense diffusion 26 and the sense node capacitance present during readout. The one bit information may be a column level comparison of the first corresponding readout voltage 44 with the threshold voltage $V_{threshold}$.

Figure 4:
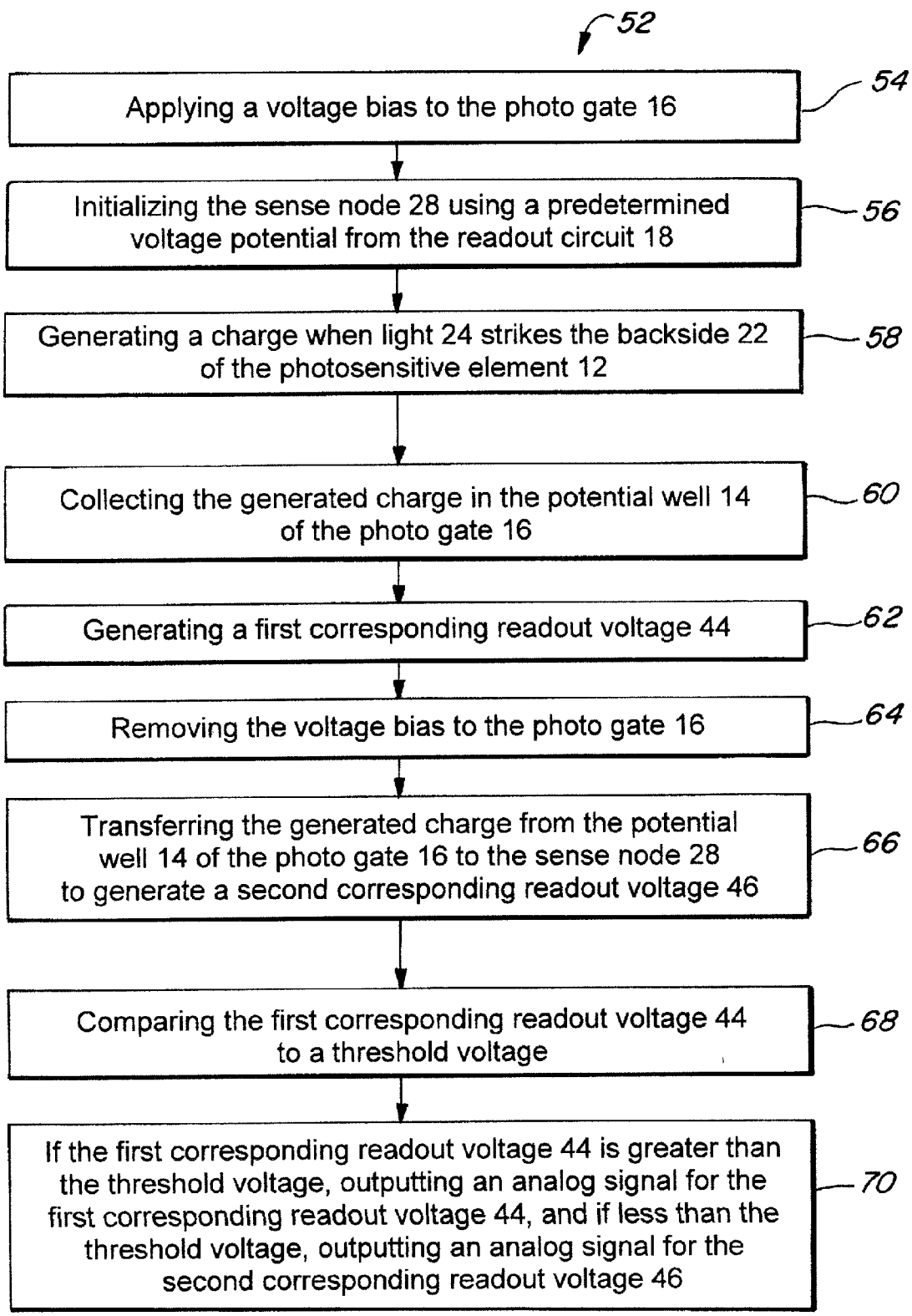
FIG. 4 is an exemplary flowchart outlining the operation of the backside illuminated CMOS image sensor of FIG. 1, according to an embodiment of the present disclosure.

FIG. 4 is an exemplary flowchart 52 outlining the operation of the backside illuminated CMOS image sensor 10 of FIG. 1, according to an embodiment of the present disclosure. The method begins by applying a voltage bias to the photo gate 16 to create a potential well 14 underneath the photo gate 16 for collecting the generated charge (54). Next the sense node 28 is initialized using a predetermined voltage potential from the readout circuit 18 (56). A charge may then be generated when light 24 strikes the backside 22 of the photosensitive element 12 (58). Next, the generated charge may be collected in the potential well 14 of the photo gate 16 (60). A first corresponding readout voltage 44 is generated while the voltage bias is applied to the photo gate 16 (62). Next, the voltage bias is removed from the photo gate 16 (64) and all generated charge is transferred from the potential well 14 to the sense node 28 to generate a second corresponding readout voltage 46 (66).

In one embodiment, a column level comparison may be made between the first corresponding readout voltage 44 and the threshold voltage $V_{threshold}$ (68). If the first corresponding readout voltage 44 is greater than the threshold voltage $V_{threshold}$, an analog signal for the first corresponding readout voltage 44 may be outputted, and if the first corresponding readout voltage 44 is less than the threshold voltage $V_{threshold}$, an analog signal for the second corresponding readout voltage 46 may be outputted (70). As can be appreciated, if the first corresponding readout voltage 44 is greater than the threshold voltage $V_{threshold}$, the step of generating a second corresponding readout voltage 46 (66) may be skipped. As explained above, the output 48 may also include a one bit information at the column level related to the comparison made at the column level between the two corresponding readout voltages 44, 46 and the threshold voltage $V_{threshold}$.

Figure 5:
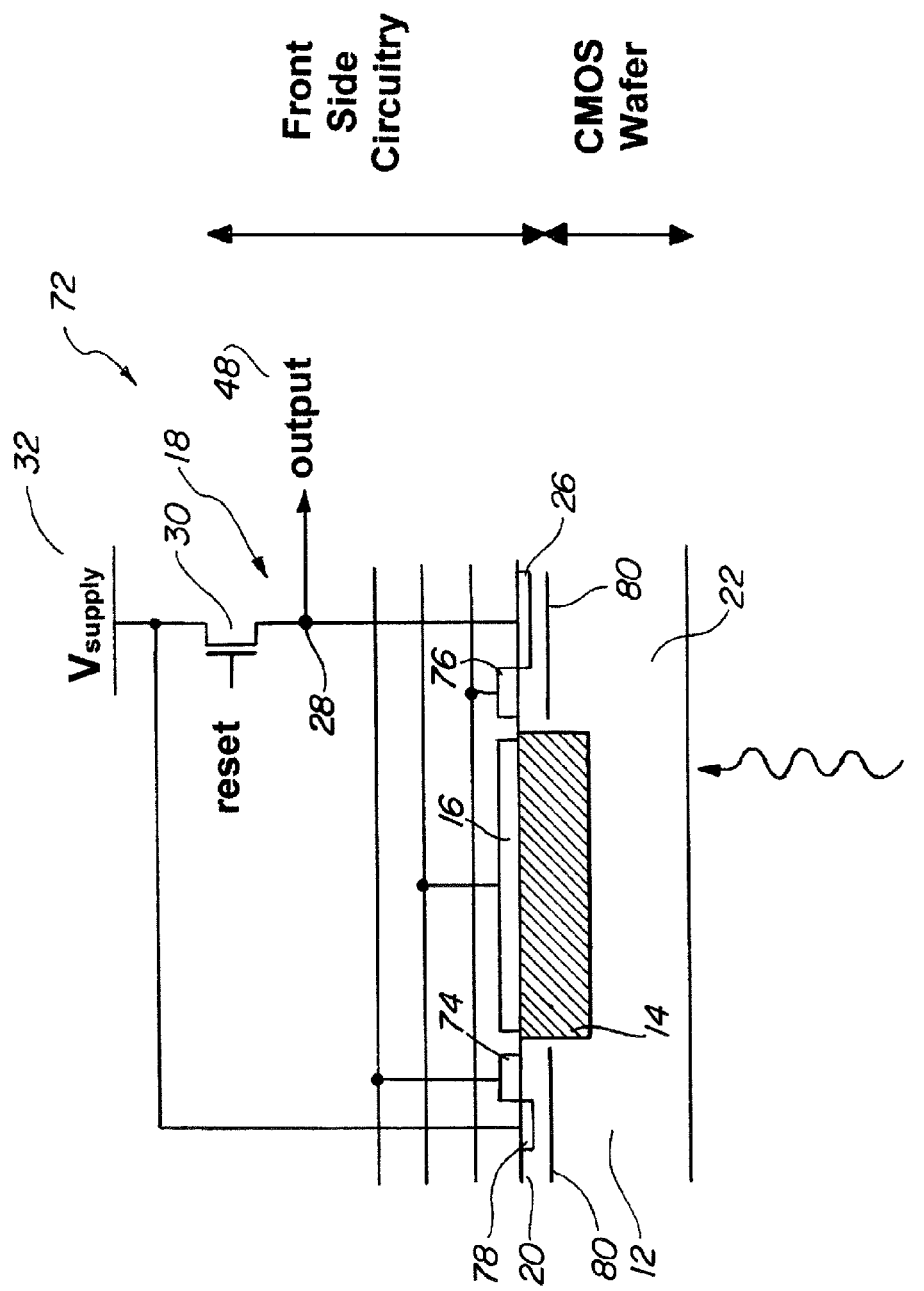
FIG. 5 is a backside illuminated CMOS image sensor for snapshot shutter implementation, according to an embodiment of the present disclosure.

FIG. 5 is a backside illuminated CMOS image sensor 72 for snapshot shutter implementation, according to an embodiment of the present disclosure. The backside illuminated CMOS image sensor 72 may include a plurality of pixels, each pixel may include a photosensitive element 12, a potential well 14, a photo gate 16, a readout circuit 18, a drain switch 74, a transfer switch 76, a drainage diffusion 78 and a deep well implant 80. The backside illuminated CMOS image sensor 72 may be configured to integrate while read to provide simultaneous exposure for all pixels.

In one embodiment, the drain switch 74 may be adjacent the photo gate 16 on the front side 20 of the photosensitive element 12. The drainage diffusion 78 may be adjacent the drain switch 74 and coupled to the supply voltage 32. The drain switch 74 and the drainage diffusion 78 may be used to drain excess charge collected in the potential well 14 of the photo gate 16. The transfer switch 76 may also be adjacent the photo gate 16 on the front side 20 of the photosensitive element 12. The transfer switch 76 may be located between the photo gate 16 and the sense diffusion 26. The transfer switch 76 may be used to transfer the released charge from the photo gate 16 to the sense node 28 and to isolate the charge transferred to the sense node 28 from the photo gate 16. As can be appreciated, each pixel can include a plurality of drain switches 74 for draining the excess charge collected in the potential well 14 of the photo gate 16. Each pixel may also include a plurality of transfer switches 76 for transferring the released charge from the photo gate 16 to the sense node 28 and for isolating the charge transferred to the sense node 28 from the photo gate 16. In one embodiment, the deep well implant 80 may be a deep p implant to shield the sense diffusion 26 from parasitic charge integration. The deep p well implant 80 may also be used to shield the transfer switch 76 and the drain switch 74 from parasitic charge integration in their respective potential wells.

Figure 6:
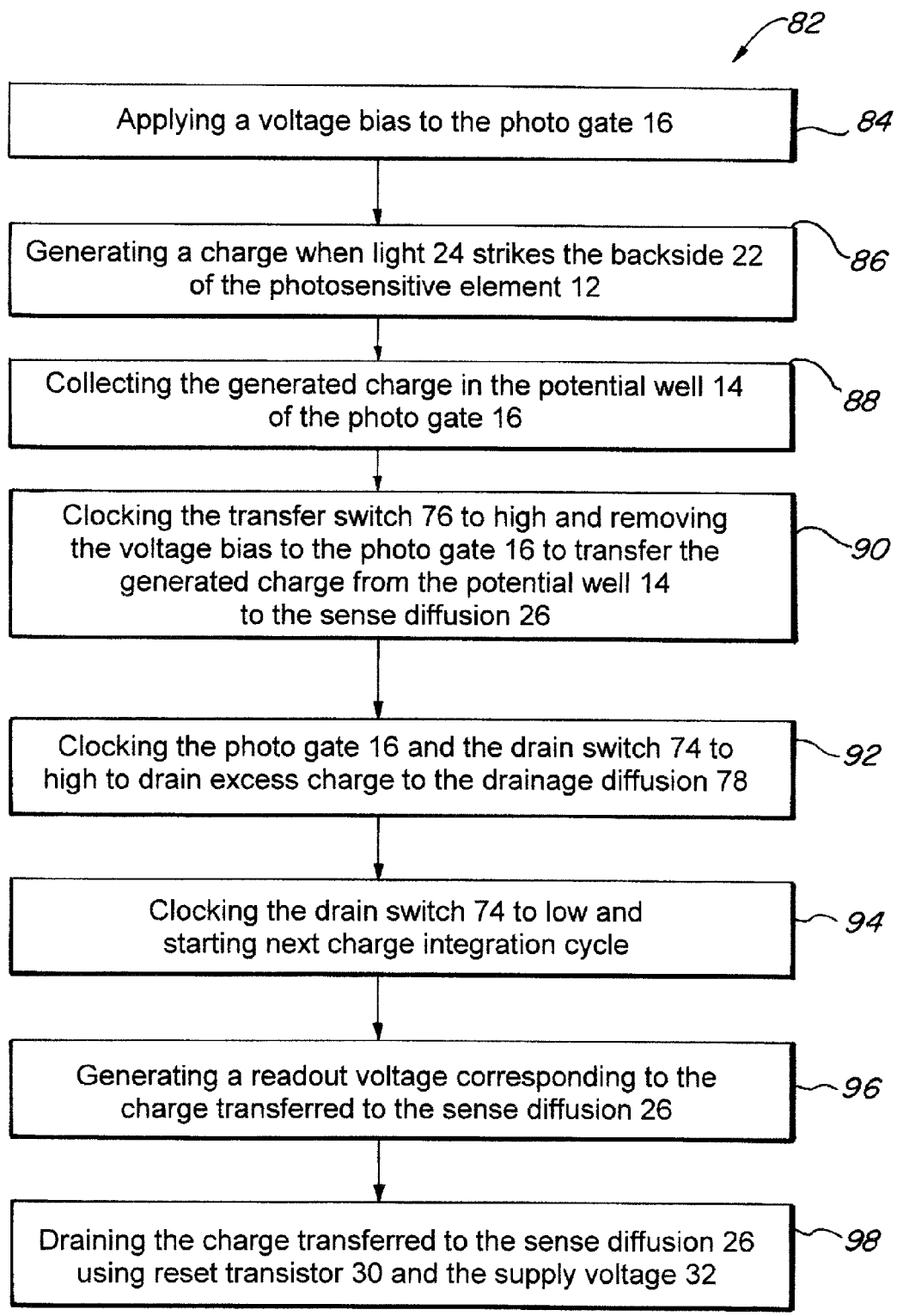
FIG. 6 is an exemplary flowchart outlining the operation of the backside illuminated CMOS image sensor of FIG. 5, according to an embodiment of the present disclosure.

FIG. 6 is an exemplary flowchart 82 outlining the operation of the backside illuminated CMOS image sensor 72 of FIG. 5, according to an embodiment of the present disclosure. To provide charge integrate while read functionality, each pixel in the backside illuminated CMOS image sensor 72 operates as follows. A voltage bias may be applied to the photo gate 16 to create a potential well 14 underneath the photo gate 16 for collecting the generated charge (84). Next, a charge may be generated when light 24 strikes the backside 22 of the photosensitive element 12 (86). The generated charge may be collected in the potential well 14 of the photo gate 16 (88). The transfer switch 76 may then be clocked to high and the generated charge may be transferred from the potential well 14 to the sense node 28 by removing the voltage bias to the photo gate 16, thereby clocking the photo gate 16 to a low, for example, to 0 Volts (90). Since light 24 is still striking the backside 22 of the photosensitive element 12, more charge is generated by the photosensitive element 12. The excess charge may be drained to drainage diffusion 78 by clocking the photo gate 16 and the drain switch 74 to high (92). As such, the photo gate 16 is continuously drained for the remainder of the frame time so that no additional charge is collected. Next, the readout pointer may be used to measure a corresponding readout voltage from the pixel (96). The reset transistor 30 and the supply voltage 32 may then be used to drain the charge transferred to the sense node 28 after readout (98). Hence, the pixel may start charge integration while there is still a signal charge on the sense node 28 from the previous frame (94). As can be appreciated, this may be performed over an entire array of pixels.

As can be appreciated, the present invention provides higher sensitivity as compared to front side illuminated imagers. For example, the quantum efficiency is not reduced by fill factor, absorption or reflection in gate electrode, and absorption, reflection or interference in Inter Layer Dielectrics (ILD). The present invention may also be used to provide a wide dynamic range. Additionally, the present invention may provide higher full well capacity as compared to prior art photo diode based CMOS imagers. In one embodiment, the present invention provides about five times as much full well capacity in comparison to prior art photo diode based CMOS imagers.

Applications of the present invention may include visible video and still picture digital cameras. The present invention may also be used for mobile phone cameras for high sensitivity, wider dynamic range, and lower cost. Similarly, the present invention may be utilized with adaptive optics imaging systems for higher sensitivity at high frame rates and more pixel level functionality. Furthermore, the present invention may be used with automotive cameras for wide dynamic range and lower cost. In one embodiment, the present invention may be suited for implementation on high resistivity silicon with back bias causing the potential well underneath the photo gate to reach to the back side.

While the back side illuminated CMOS image sensor with photo gate pixel has been described in terms of what are presently considered to be the most practical and preferred embodiments, it is to be understood that the disclosure need not be limited to the disclosed embodiments. It should also be understood that a variety of changes may be made without departing from the essence of the invention. Such changes are also implicitly included in the description. They still fall within the scope of this disclosure. It should be understood that this disclosure is intended to yield a patent covering numerous aspects of the invention both independently and as an overall system and in both method and apparatus modes.

Further, each of the various elements of the invention and claims may also be achieved in a variety of manners. This disclosure should be understood to encompass each such variation, be it a variation of an embodiment of any apparatus embodiment, a method or process embodiment, or even merely a variation of any element of these. Particularly, it should be understood that as the disclosure relates to elements of the invention, the words for each element may be expressed by equivalent apparatus terms or method terms—even if only the function or result is the same. Such equivalent, broader, or even more generic terms should be considered to be encompassed in the description of each element or action. Such terms can be substituted where desired to make explicit the implicitly broad coverage to which this invention is entitled.

It should be understood that all actions may be expressed as a means for taking that action or as an element which causes that action. Similarly, each physical element disclosed should be understood to encompass a disclosure of the action which that physical element facilitates.

It should be understood that various modifications and similar arrangements are included within the spirit and scope of the claims, the scope of which should be accorded the broadest interpretation so as to encompass all such modifications and similar structures. The present disclosure includes any and all embodiments of the following claims.

The invention claimed is:

1. A backside illuminated CMOS image sensor with a front side and a back side, the backside illuminated CMOS sensor comprising:
    a photosensitive element on the back side, for releasing charge when light strikes the photosensitive element;
    a photo gate on the front side, the photo gate having a potential well for receiving the released charge from the photosensitive element;
    a sense diffusion for receiving the released charge from the potential well;
    a readout circuit coupled to the sense diffusion, for measuring a voltage corresponding to the released charge transferred to the sense diffusion;
    a drain switch adjacent the photo gate on the front side, for draining excess charge from the photo gate; and
    comparison circuitry arranged to compare the voltage measured by the readout circuit to a threshold voltage;
    said readout circuit further arranged to:
        generate a first corresponding readout voltage based on the voltage at said sense diffusion prior to the transfer of said released charge from said photo gate to said sense diffusion when the voltage at said sense diffusion prior to the transfer of said released charge is greater than a threshold voltage, and to
        generate a second corresponding readout voltage based on the voltage at said sense diffusion after the transfer of said released charge from said photo gate to said sense diffusion when the voltage at said sense diffusion prior to the transfer of said released charge is less than said threshold voltage.

2. The backside illuminated CMOS image sensor of claim 1 further comprising a transfer switch between the photo gate and the sense diffusion, for transferring the released charge from the photo gate to the sense diffusion and for isolating the charge transferred to the sense diffusion from the photo gate.

3. The backside illuminated CMOS image sensor of claim 2 further comprising a deep well implant for shielding the transfer switch and the sense diffusion from capacitive coupling and incident photons.

4. The backside illuminated CMOS image sensor of claim 1 further comprising a reset transistor and a supply voltage, for draining the charge transferred to the sense diffusion after readout.

5. A backside illuminated CMOS image sensor with a front side and a back side, the backside illuminated CMOS sensor comprising:
    a photosensitive element on the back side, for releasing charge when light strikes the photosensitive element;
    a photo gate on the front side, the photo gate having a potential well for receiving the released charge from the photosensitive element;
    a sense diffusion for receiving the released charge from the potential well;
    a transfer switch between the photo gate and the sense diffusion, for transferring the released charge from the photo gate to the sense diffusion and for isolating the charge transferred to the sense diffusion from the photo gate;

a drain switch adjacent the photo gate on the front side, for draining excess charge from the photo gate;
a readout circuit coupled to the sense diffusion, for measuring a voltage corresponding to the released charge transferred to the sense diffusion; and
a deep well implant for shielding the transfer switch, the drain switch and the sense diffusion from parasitic charge integration.

6. A pixel for a CMOS photo sensor, comprising:
a photosensitive element having a front side and a back side, for releasing charge when light strikes the back side of the photosensitive element;
a potential well for receiving the released charge from the photosensitive element;
a photo gate on the front side of the photosensitive element, for transferring the released charge from the potential well to a sense node;
a readout circuit coupled to the sense node, for measuring a voltage at said sense node; and
comparison circuitry arranged to compare the voltage measured by the readout circuit to a threshold voltage;
said readout circuit arranged to generate a first corresponding readout voltage based on the voltage at said sense node prior to the transfer of said released charge and to generate a second corresponding readout voltage based on the voltage at said sense node after the transfer of said released charge to the sense node, said readout circuit further arranged such that:
when said first corresponding readout voltage is greater than a threshold voltage, outputting said first corresponding readout voltage, and
when said first corresponding readout voltage is less then said threshold voltage, outputting said second corresponding readout voltage.

* * * * *